United States Patent
Kuroda et al.

(10) Patent No.: US 9,774,298 B2
(45) Date of Patent: Sep. 26, 2017

(54) HIGH-FREQUENCY AMPLIFIER

(71) Applicant: Kabushiki Kaisha Toshiba, Minato-ku (JP)

(72) Inventors: Kenta Kuroda, Suginami (JP); Kazutaka Takagi, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/040,488

(22) Filed: Feb. 10, 2016

(65) Prior Publication Data

US 2016/0261236 A1  Sep. 8, 2016

(30) Foreign Application Priority Data

Mar. 6, 2015 (JP) ................................ 2015-044320

(51) Int. Cl.
*H03F 1/02* (2006.01)
*H03F 3/193* (2006.01)
(Continued)

(52) U.S. Cl.
CPC ........... *H03F 1/0205* (2013.01); *H01L 23/66* (2013.01); *H01L 24/49* (2013.01); *H03F 1/565* (2013.01); *H03F 3/193* (2013.01); *H03F 3/195* (2013.01); *H03F 3/602* (2013.01); *H01L 2223/6611* (2013.01); *H01L 2223/6655* (2013.01);
(Continued)

(58) Field of Classification Search
USPC .... 330/307, 302, 124 R, 295, 310, 133, 150
See application file for complete search history.

(56) References Cited

U.S. PATENT DOCUMENTS 5,352,990 A  10/1994  Goto
6,072,205 A   6/2000  Yamaguchi et al.
(Continued)

FOREIGN PATENT DOCUMENTS

EP  2 515 435 A2  10/2012
EP  2 637 302 A1   9/2013
(Continued)

OTHER PUBLICATIONS

U.S. Appl. No. 14/817,583, filed Aug. 4, 2015, Kazutaka Takagi.
(Continued)

*Primary Examiner* — Hieu Nguyen
(74) *Attorney, Agent, or Firm* — Oblon, McClelland, Maier & Neustadt, L.L.P.

(57) ABSTRACT

According to one embodiment, a high-frequency amplifier includes an active element and an output matching circuit. The active element is provided on a substrate. The active element is configured to amplify a signal having a frequency band. The active element includes a cell region. The output matching circuit is connected to the active element. The output matching circuit includes a wire, a transmission line and an output terminal. The wire includes an input end and an output end. The input end of the wire is connected to an output part of the cell region of the active element. The transmission line is provided on the substrate. The transmission line includes an input part and an output part. The input part of the transmission line is connected to the output end of the wire. The output terminal is provided on the substrate.

9 Claims, 5 Drawing Sheets

(51) Int. Cl.
*H03F 1/56* (2006.01)
*H01L 23/66* (2006.01)
*H01L 23/00* (2006.01)
*H03F 3/195* (2006.01)
*H03F 3/60* (2006.01)

(52) U.S. Cl.
CPC ............... *H01L 2224/4813* (2013.01); *H01L 2224/48157* (2013.01); *H01L 2224/49111* (2013.01); *H01L 2224/49175* (2013.01); *H01L 2924/00014* (2013.01); *H01L 2924/13064* (2013.01); *H01L 2924/30111* (2013.01); *H03F 2200/222* (2013.01); *H03F 2200/387* (2013.01); *H03F 2200/423* (2013.01); *H03F 2200/451* (2013.01)

(56) References Cited

U.S. PATENT DOCUMENTS

| | | | |
|---|---|---|---|
| 6,396,348 | B1 | 5/2002 | Honjo |
| 7,825,731 | B2 * | 11/2010 | Ohnishi ............ H03F 1/565 330/126 |
| 2012/0268211 | A1 | 10/2012 | Ng et al. |
| 2013/0234794 | A1 | 9/2013 | Takagi |

FOREIGN PATENT DOCUMENTS

| | | |
|---|---|---|
| JP | 2009-207060 | 9/2009 |
| JP | 2010-154235 | 7/2010 |
| JP | 2011-66782 A | 3/2011 |
| JP | 2012-227342 A | 11/2012 |
| JP | 2013-187773 | 9/2013 |
| JP | 2013-187774 | 9/2013 |
| JP | 2013-187775 | 9/2013 |
| JP | 2016-58821 A | 4/2016 |
| JP | 2016-92527 A | 5/2016 |
| WO | WO 2010/142462 A1 | 12/2010 |

OTHER PUBLICATIONS

U.S. Appl. No. 14/801,227, filed Jul. 16, 2015, Kazutaka Takagi.

Japanese Office Action issued Nov. 18, 2016 in Japanese Patent Application No. 2015-044320 with English translation.

Extended European Search Report dated Jul. 6, 2016 in European Patent Application No. 16155449.8.

* cited by examiner

HIGH-FREQUENCY AMPLIFIER

CROSS-REFERENCE TO RELATED APPLICATIONS

This application is based upon and claims the benefit of priority from the prior Japanese Patent Application No. 2015-044320, filed on Mar. 6, 2015; the entire contents of which are incorporated herein by reference.

FIELD

Embodiments described herein relate generally to a high-frequency amplifier.

BACKGROUND

The efficiency of a high-frequency amplifier for amplifying a signal having a frequency in the microwave band can be improved by processing harmonics generated from active elements in the high-frequency amplifier. One of the proposed methods for achieving such improvement in efficiency is to make the impedance at the second harmonic frequency near-open.

BRIEF DESCRIPTION OF THE DRAWINGS

FIG. 2 is a schematic side view in which FIG. 1 is seen from the −Y-direction;

FIG. 6 is a schematic side view in which FIG. 5 is seen from the −Y-direction;

FIG. 8 is a schematic side view in which FIG. 7 is seen from the −Y-direction;

FIG. 10 is a schematic side view in which FIG. 9 is seen from the −Y-direction.

DETAILED DESCRIPTION

According to one embodiment, a high-frequency amplifier includes an active element and an output matching circuit. The active element is provided on a substrate. The active element is configured to amplify a signal having a frequency band. The active element includes a cell region. The output matching circuit is connected to the active element. The output matching circuit includes a wire, a transmission line and an output terminal. The wire includes an input end and an output end. The input end of the wire is connected to an output part of the cell region of the active element. The transmission line is provided on the substrate. The transmission line includes an input part and an output part. The input part of the transmission line is connected to the output end of the wire. The output terminal is provided on the substrate. The output terminal is connected to the output part of the transmission line. The active element has an output impedance of $(R_{out1} - jX_{out1})\Omega$ at a center frequency of the frequency band. Load impedance seen from a reference plane of the input part of the transmission line has a real part of $(0.8 \times R_{out1})\Omega$ or more and $(1.2 \times R_{out1})\Omega$ or less at the center frequency. Load impedance seen from a reference plane of the input end of the wire has an imaginary part of $(0.8 \times X_{out1})\Omega$ or more and $(1.2 \times X_{out1})\Omega$ or less at the center frequency.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In this specification and the drawings, components similar to those described previously with reference to earlier figures are labeled with like reference numerals, and the detailed description thereof is omitted appropriately.

A first embodiment is now described.

First, the configuration of a high-frequency amplifier according to this embodiment is described.

Figure 1:
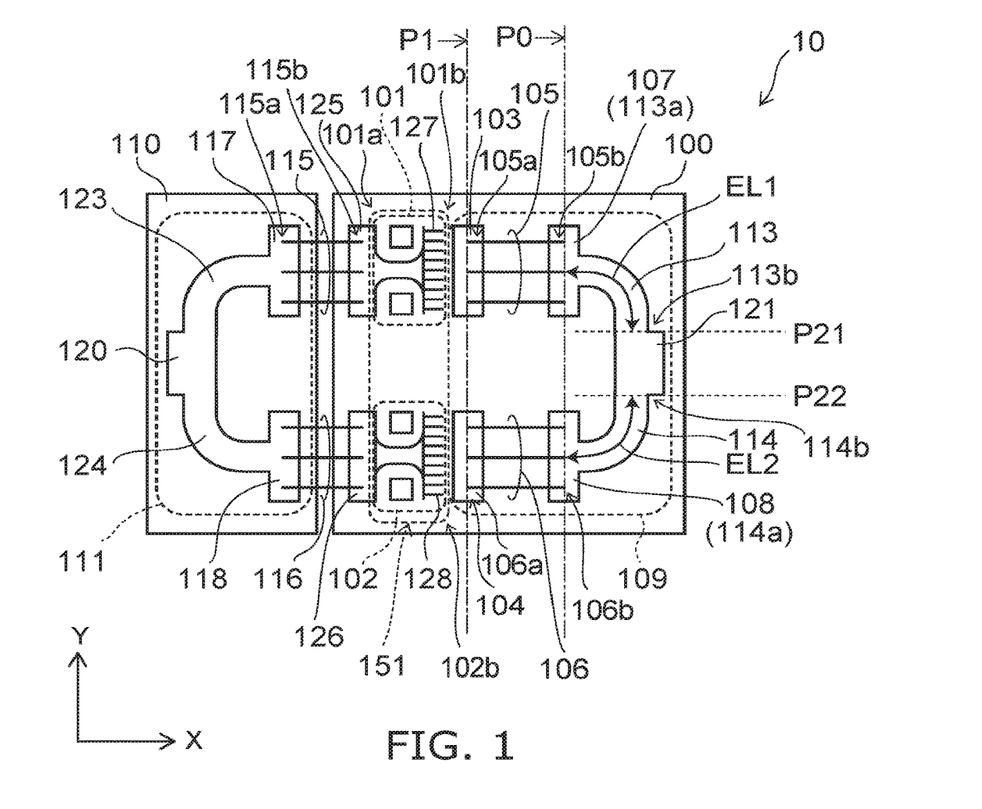
FIG. 1 is a schematic plan view illustrating the high-frequency amplifier according to a first embodiment.

FIG. 1 is a schematic plan view illustrating the high-frequency amplifier according to this embodiment.

Figure 2:
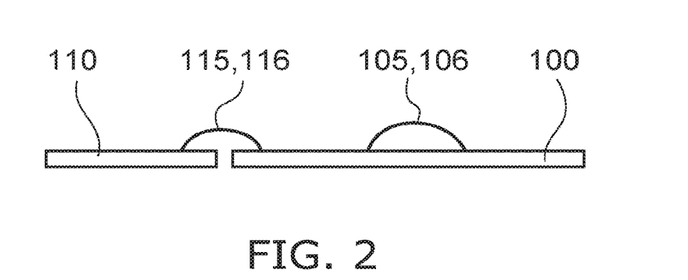

FIG. 2 is a schematic side view in which FIG. 1 is seen from the −Y-direction.

In the following, for convenience of description, an X-Y orthogonal coordinate system is adopted in this specification. In FIG. 1, the direction from the input terminal 120 to the output terminal 121 is referred to as "X-direction". A direction perpendicular thereto is referred to as "Y-direction". The "Y-direction" is directed from the electrode pad 104 to the electrode pad 103. The direction opposite to the "X-direction" is referred to as "−X-direction". The direction opposite to the "Y-direction" is referred to as "−Y-direction".

In this specification, the fundamental signal S has a frequency band Bw. The center frequency $f_0$ in the frequency band Bw is referred to as "fundamental frequency $f_0$". The frequency of twice the "fundamental frequency $f_0$" is referred to as "second harmonic frequency".

In this specification, the impedance is expressed in units of $\Omega$, which is omitted.

As shown in FIG. 1, the high-frequency amplifier 10 according to this embodiment includes a substrate 100 and an active element 151 provided on the substrate 100. The active element 151 is composed of a cell region 101 for amplifying a fundamental signal S having a frequency band Bw, and a cell region 102 for amplifying the fundamental signal S having the frequency band Bw. The cell region 101, 102 can be e.g. a HEMT (high electron mobility transistor) or MESFET (metal semiconductor field effect transistor) including a gate, a drain, and a source.

The high-frequency amplifier 10 according to this embodiment is further composed of an electrode pad 103, an electrode pad 104, an output matching circuit 109, an electrode pad 125, a wire 115, an electrode pad 126, a wire 116, and an input matching circuit 111. The electrode pad 103 is separately provided near the finger gate 127 of the cell region 101 on the substrate 100, and connected to the drain serving as the output part 101b of the cell region 101. The electrode pad 104 is separately provided near the finger gate 128 of the cell region 102 on the substrate 100, and connected to the drain serving as the output part 102b of the cell region 102. The electrode pad 125 is connected to the finger gate 127 of the cell region 101. The wire 115 is connected to the electrode pad 125. The electrode pad 126 is connected to the finger gate 128 of the cell region 102. The wire 116 is connected to the electrode pad 126. The electrode pads 103, 104 extend in the Y-direction and have a comparable length.

The DC circuit for supplying voltage to the active element 151 is not shown.

The output matching circuit 109 is a circuit for matching the output impedance of the cell region 101, 102 of the active element 151 with the impedance of an external load. The output impedance is measured by e.g. the load-pull measurement. The output matching circuit 109 is placed on the substrate 100 and connected to the active element 151. In the output matching circuit 109, an output terminal 121 is placed in the X-direction end part of the substrate 100. Transmission lines 113, 114 are branched from the output terminal 121. The output terminal 121 may be a transmission line having a short electrical length.

The output matching circuit 109 further includes wires 105 and 106.

The transmission line 113 includes a wire pad 107 serving as an input part 113a, and an output part 113b including a connection position P21 (shown by a dashed line in FIG. 1) with the output terminal 121. The input part 113a of the transmission line 113 is connected to the output end 105b of the wire 105. The output part 113b of the transmission line 113 is connected to the output terminal 121. The electrical length between the connection position (coinciding with the reference plane P0 in FIG. 1) with the wire 105 in the wire pad 107 and the connection position P21 is denoted by EL1. The electrical length EL1 is approximately 0.25 times the wavelength at the fundamental frequency $f_0$ of the transmitted signal. Thus, the transmission line 113 operates as a quarter wavelength transformer.

The transmission line 114 includes a wire pad 108 serving as an input part 114a, and an output part 114b including a connection position P22 (shown by a dashed line in FIG. 1) with the output terminal 121. The input part 114a of the transmission line 114 is connected to the output end 106b of the wire 106. The output part 114b of the transmission line 114 is connected to the output terminal 121. The electrical length between the connection position (coinciding with the reference plane P0 in FIG. 1) with the wire 106 in the wire pad 108 and the connection position P22 is denoted by EL2 ($\approx$EL1). The electrical length EL2 is approximately 0.25 times the wavelength at the fundamental frequency $f_0$ of the transmitted signal. Thus, the transmission line 114 operates as a quarter wavelength transformer.

The aforementioned term "approximately 0.25 times" refers to e.g. 0.2 times or more and 0.3 times or less.

The reference plane P0 is a plane including the connection part between the wire pad 107 of the transmission line 113 and the wire 105, and the connection part between the wire pad 108 of the transmission line 114 and the wire 106.

The reference plane P1 is a plane including the connection part between the wire 105 and the electrode pad 103, and the connection part between the wire 106 and the electrode pad 104.

The input end 105a of the wire 105 is connected to the output part 101b of the cell region 101 through the electrode pad 103. The output end 105b is connected to the wire pad 107.

The input end 106a of the wire 106 is connected to the output part 102b of the cell region 102 through the electrode pad 104. The output end 106b is connected to the wire pad 108.

As shown in FIG. 2, in the wire 105, the middle portion extending from the electrode pad 103 to the wire pad 107 is separated from the substrate 100 and not in contact with the substrate 100. Likewise, in the wire 106, the middle portion extending from the electrode pad 104 to the wire pad 108 is separated from the substrate 100 and not in contact with the substrate 100.

An external load (not shown) is usually connected externally as viewed from the output terminal 121. The impedance of the external load is e.g. 50Ω.

The input matching circuit 111 is a circuit for matching with the input impedance of the active element 151. The input matching circuit 111 is placed on e.g. a substrate 110 different from the substrate 100. In the input matching circuit 111, the input terminal 120 is placed in the −X-direction end part of the substrate 110. Transmission lines 123, 124 are branched from the input terminal 120. The transmission line 123 is extracted in the Y-direction from one X-direction end part of the input terminal 120. The transmission line 123 is then curved and extends in the X-direction. The transmission line 123 is then connected to the central part of a wire pad 117 extending in the Y-direction. The transmission line 124 is extracted in the −Y-direction from one X-direction end part of the input terminal 120. The transmission line 124 is then curved and extends in the X-direction. The transmission line 124 is then connected to the central part of a wire pad 118 extending in the Y-direction. The wire pads 117 and 118 have a comparable Y-direction length.

The wire 115 includes an input end 115a and an output end 115b. The input end 115a of the wire 115 is connected to the wire pad 117 of the input matching circuit 111. The output end 115b of the wire 115 is connected to the input part 101a of the cell region 101. The cell region 101 and the wire 115 may be connected through the electrode pad 125. The wire 116 connects the wire pad 118 and the electrode pad 126.

As shown in FIG. 2, the middle portion of the wire 115 extending from the wire pad 117 to the electrode pad 125 is separated from the substrates 100 and 110 and not in contact with the substrates 100 and 110. Likewise, the middle portion of the wire 116 extending from the wire pad 118 to the electrode pad 126 is separated from the substrates 100 and 110 and not in contact with the substrates 100 and 110.

The operating condition of the cell regions 101 and 102 of the active element 151 shown in FIG. 1 is made equal. Thus, the cell regions 101 and 102 are operated uniformly to eliminate the signal routed from the output part 101b of the cell region 101 to the output part 102b of the cell region 102 and the signal routed from the output part 102b of the cell region 102 to the output part 101b of the cell region 101. In this case, the circuit mounted on the substrate 100 shown in FIG. 1 can be represented as an equivalent circuit shown in FIG. 3.

Next, the operation of the high-frequency amplifier according to this embodiment is described.

Figure 3:
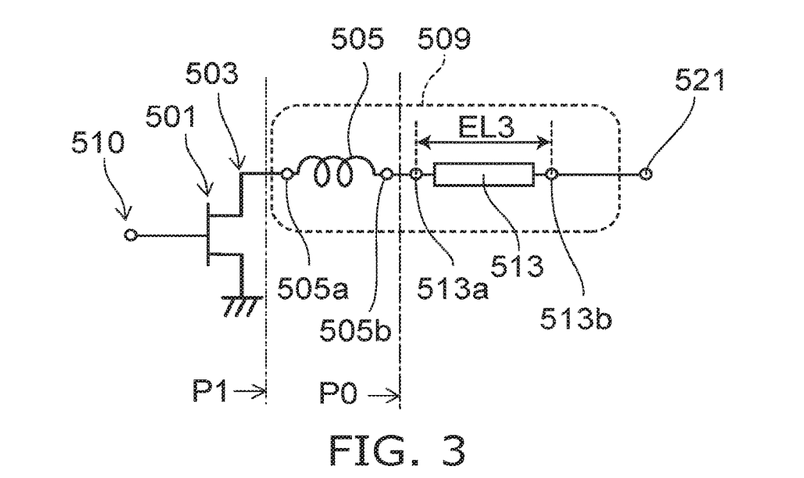
FIG. 3 is an equivalent circuit diagram of the circuit mounted on the substrate 100 shown in FIG. 1.

FIG. 3 is an equivalent circuit diagram of the circuit mounted on the substrate 100 shown in FIG. 1.

Figure 4:
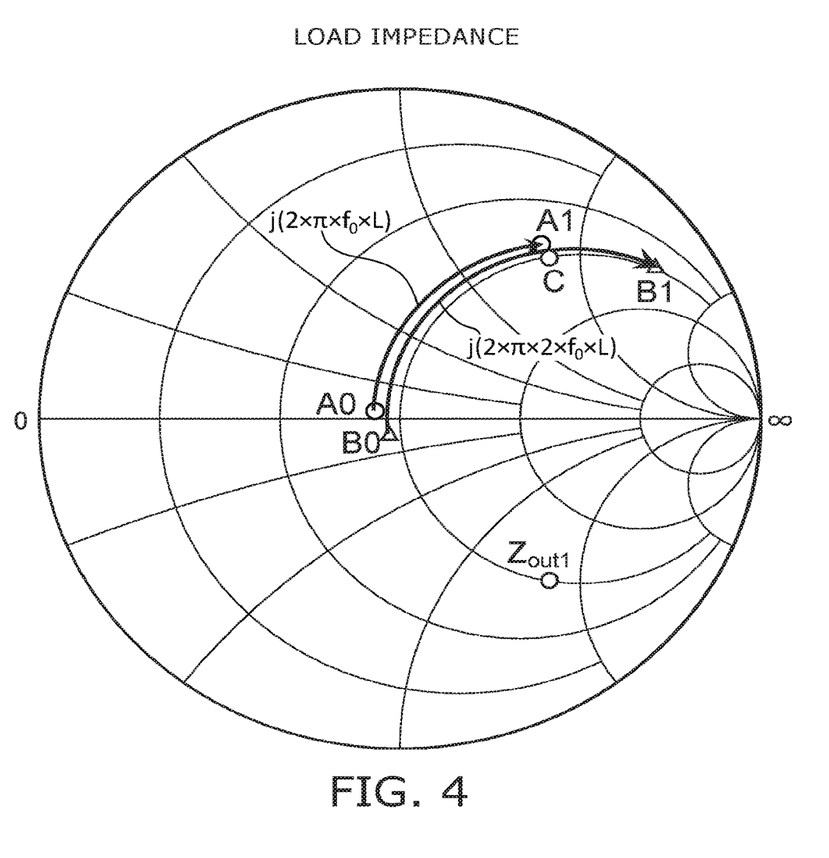
FIG. 4 is a Smith chart illustrating a result of simulating the impedance when the output terminal 121 side is seen from the reference plane P0 and the reference plane P1 shown in FIG. 1.

FIG. 4 is a Smith chart illustrating a result of simulating the impedance when the output terminal 121 side is seen from the reference plane P0 and the reference plane P1 shown in FIG. 1.

The gate 510 shown in FIG. 3 corresponds to the electrode pad 125, 126 shown in FIG. 1. The active element 501 corresponds to the cell region 101, 102 shown in FIG. 1. The drain 503 corresponds to the electrode pad 103, 104 shown in FIG. 1. The wire 505 shown in FIG. 3 corresponds to the wire 105, 106 shown in FIG. 1. The output matching circuit 509 corresponds to the output matching circuit 109 shown in FIG. 1. The transmission line 513 (electrical length EL3) corresponds to the transmission line 113, 114 shown in FIG. 1. The output terminal 521 corresponds to the output terminal 121 shown in FIG. 1.

As shown in FIG. 2, the wire 105 is separated from the substrate 100 in the middle portion of the line segment. Thus, the wire 105 has a smaller parasitic component than that patterned on the substrate. Accordingly, the wire 105 can be treated as a more ideal lumped-parameter element.

The point A0 shown in FIG. 4 represents load impedance $R_{10}+jX_{11}$ at the fundamental frequency $f_0$ when the output terminal 521 (output terminal 121 in FIG. 1) side shown in FIG. 3 is seen from the reference plane P0 shown in FIG. 3. The point A1 shown in FIG. 4 represents load impedance $R_{10}+jX_{10}$ at the fundamental frequency $f_0$ when the output terminal 521 side shown in FIG. 3 is seen from the reference plane P1 shown in FIG. 3. The point B0 shown in FIG. 4 represents load impedance $R_{20}+jX_{21}$ at the second harmonic frequency when the output terminal 521 side shown in FIG. 3 is seen from the reference plane P0 shown in FIG. 3. The point B1 shown in FIG. 4 represents load impedance $R_{20}+jX_{20}$ at the second harmonic frequency when the output terminal 521 side shown in FIG. 3 is seen from the reference plane P1 shown in FIG. 3. Here, $R_{10}$ and $R_{20}$ are resistances, and $X_{10}$, $X_{11}$, $X_{20}$, and $X_{21}$ are reactances.

FIG. 4 is normalized by the value of the real part of the output impedance of the active element 501 shown in FIG. 3.

As shown in FIG. 4, the addition of the wire 505 shown in FIG. 3 (wire 105, 106 in FIG. 1) moves the impedance at the fundamental frequency $f_0$ from the point A0 to the point A1. This is because the impedance is increased by $j(2\times\pi\times f_0\times L)$ from $R_{10}+jX_{11}$ represented by the point A0 and moved to $R_{10}+jX_{10}$ represented by the point A1 due to the addition of the wire 505 having inductance L as a lumped-parameter element. Here, $f_0$ is the fundamental frequency. The following relation (1) holds between $jX_{11}$ and $jX_{10}$.

$$jX_{10}=j(X_{11}+2\times\pi\times f_0\times L) \quad (1)$$

The impedance at the second harmonic frequency moves from the point B0 to the point B1. This is because the impedance is increased by $j(2\times\pi\times 2\times f_0\times L)$ from $R_{20}+jX_{21}$ represented by the point B0 and moved to $R_{20}+jX_{20}$ represented by the point B1 due to the addition of the wire 505 having inductance L as a lumped-parameter element. The following relation (2) holds between $jX_{21}$ and $jX_{20}$.

$$jX_{20}=j(X_{21}+2\times\pi\times 2\times f_0\times L) \quad (2)$$

In the high-frequency amplifier 10 according to this embodiment, the impedance of the point A0 can be moved to the impedance of the point A1 by adjusting and adding the value of the inductance L of the wire 505 shown in FIG. 3. The output impedance $Z_{out1}$ of the active element 501 at the fundamental frequency $f_0$ is denoted by $Z_{out1}=R_{out1}-jX_{out1}$. The movement is performed so that the point A1 is located near the point $C(R_{out1}+jX_{out1})$ representing the complex conjugate impedance of the output impedance $Z_{out1}$.

More specifically, the inductance L of the wire 505 shown in FIG. 3 is changed by adjusting the length of the wire 105, 106 shown in FIG. 1. Thus, the impedance of the point A1 is set near the complex conjugate point C of the output impedance $Z_{out1}$ of the active element 151 (cell region 101). This can achieve impedance matching at the fundamental frequency $f_0$. Here, $Z_{out1}$ is the impedance, $R_{out1}$ is the resistance, and $X_{out1}$ is the reactance.

To set the point A1 ($R_{10}+jX_{10}$) near the point $C(R_{out1}+jX_{out1})$, for instance, it is preferable to set the resistance $R_{10}$ to $0.8\times R_{out1}$ (Ω) or more and $1.2\times R_{out1}$ (Ω) or less, and to set the reactance $X_{10}$ to $0.8\times X_{out1}$ (Ω) or more and $1.2\times X_{out1}$ (Ω) or less.

As shown in the foregoing relation (2), the amount of reactance added at the second harmonic is twice the amount of reactance added at the fundamental. Thus, as shown in FIG. 4, the reactance of the point B1 has a larger value than the reactance of the point A1 representing the impedance at the fundamental frequency. By the larger reactance, the impedance of the point B1 can be made near-open.

When the output terminal 121 side is seen from the reference plane P1, the reactance $X_{20}$ of the impedance (point B1) at the second harmonic frequency is larger than $1.2\times X_{out1}$ (Ω).

As a result, the high-frequency amplifier 10 can be operated at high efficiency.

As shown in FIG. 4, when the output terminal 521 side is seen from the reference plane P0, the resistance $R_{10}$ of the impedance point A0 at the fundamental frequency $f_0$ is preferably adjusted by the transmission line 113, 114 so as to be comparable with the resistance $R_{out1}$ of the output impedance $Z_{out1}$ of the active element 501. For instance, the resistance $R_{10}$ is preferably set to $0.8\times R_{out1}$ (Ω) or more and $1.2\times R_{out1}$ (Ω) or less.

Next, the effect of the high-frequency amplifier according to this embodiment is described.

The high-frequency amplifier 10 according to this embodiment achieves the following effects (a1) and (b1) by using the wires 105 and 106 shown in FIG. 1 (wire 505 in FIG. 3).

(a1) The impedance $R_{10}+jX_{10}$ at the fundamental frequency $f_0$ represented by the point A1 in FIG. 4 is set near the complex conjugate point $C(R_{out1}+jX_{out1})$ of the output impedance of the active element 501 at the fundamental frequency $f_0$ to achieve matching. Thus, the fundamental signal S at the fundamental frequency $f_0$ is transferred to the output terminal 521 with low return loss.

(b1) The impedance $R_{20}+jX_{20}$ at the second harmonic frequency represented by the point B1 in FIG. 4 is moved to the position having larger impedance than the point A1 and made near-open. Thus, the signal at the second harmonic frequency has high return loss and is not substantially transferred to the output terminal 521.

A high-frequency amplifier having high efficiency can be provided as the result of (a1) and (b1).

In the high-frequency amplifier 10 according to this embodiment, the number of the wires 105 and the wires 106 shown in FIG. 1 is e.g. three for each. However, the embodiment is not limited thereto.

Next, a second embodiment is described.

Figure 5:
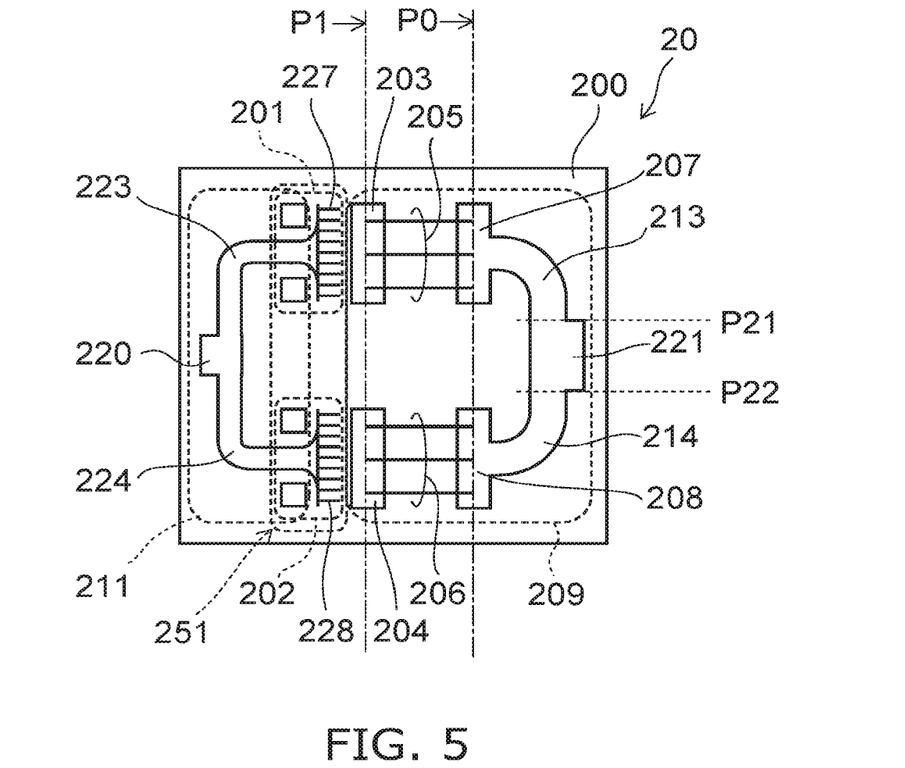
FIG. 5 is a schematic plan view illustrating a high-frequency amplifier according to a second embodiment.

FIG. 5 is a schematic plan view illustrating a high-frequency amplifier according to this embodiment.

Figure 6:
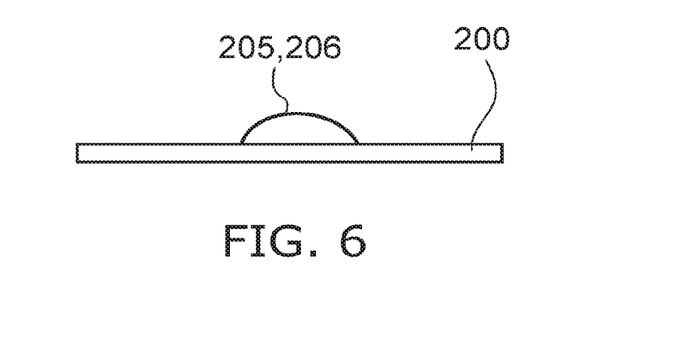

FIG. 6 is a schematic side view in which FIG. 5 is seen from the −Y-direction.

As shown in FIGS. 5 and 6, the high-frequency amplifier according to this embodiment is different from the high-frequency amplifier 10 according to above first embodiment in the following points (a2)-(d2).

(a2) The input matching circuit 211, the cell region 201, the cell region 202, the electrode pad 203, the electrode pad 204, and the output matching circuit 209 are placed on the substrate 200.

(b2) There is no portion corresponding to the wire pad 117, the wire pad 118, the wire 115, the wire 116, the electrode pad 125, and the electrode pad 126 shown in FIG. 1.

(c2) The transmission line 223 is connected to the input part 225 of the cell region 201 without the intermediary of an electrode pad.

(d2) The transmission line 224 is connected to the input part 226 of the cell region 202 without the intermediary of an electrode pad.

In this embodiment, as indicated in (b2) described above, there is no portion corresponding to the wire pad 117, the wire pad 118, the wire 115, the wire 116, the electrode pad 125, and the electrode pad 126. This can reduce the footprint of the high-frequency amplifier 20.

The configuration, operation, and effect of this embodiment other than the foregoing are similar to those of the above first embodiment.

Next, a third embodiment is described.

Figure 7:
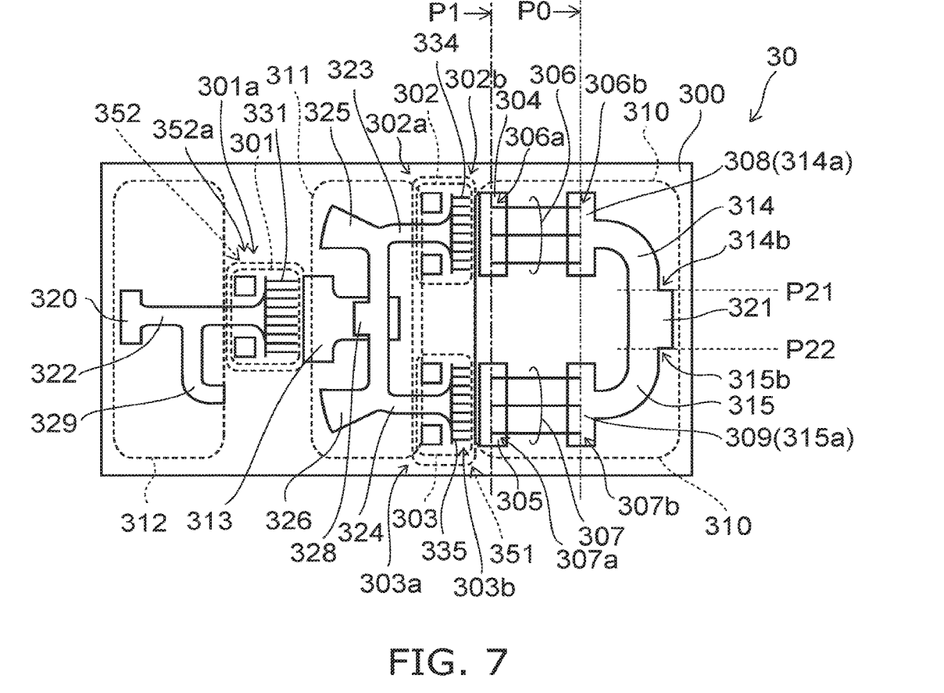
FIG. 7 is a schematic plan view illustrating the high-frequency amplifier according to a third embodiment.

FIG. 7 is a schematic plan view illustrating the high-frequency amplifier according to this embodiment.

Figure 8:
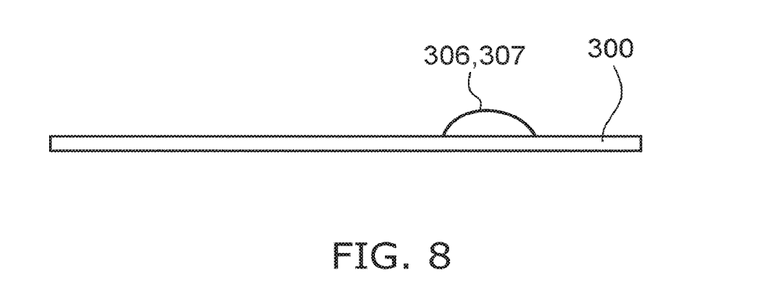

FIG. 8 is a schematic side view in which FIG. 7 is seen from the −Y-direction.

As shown in FIGS. 7 and 8, the high-frequency amplifier according to this embodiment is different from the high-frequency amplifier 20 according to above second embodiment primarily in the following points (a3)-(c3).

(a3) In order to improve the gain of the high-frequency amplifier 30, an input matching circuit 312, an active element 352 including a cell region 301, and an electrode pad 313 connected to the drain of the active element 301 are added and placed on the substrate 300. The electrode pad 313 is connected to the input terminal 328 of an interstage matching circuit 311. The input matching circuit 312 is connected to the input part 352a of the active element 352.

(b3) The input matching circuit 312 is a circuit for matching with the input impedance of the cell region 301. In the input matching circuit 312, the input terminal 320 is placed in the −X-direction end part of the substrate 300. A transmission line 322 extends therefrom in the X-direction. One X-direction end part of the transmission line 322 is connected to the finger gate 331 of the cell region 301. A transmission line 329 is branched from the X-direction central part of the transmission line 322 and extracted in the −Y-direction. The transmission line 329 is then curved, extends in the X-direction, and is terminated. The Y-direction length of the input terminal 320 is comparable with the Y-direction length of the output terminal 321.

(c3) The interstage matching circuit 311 includes a protrusion 325 in the curved part of the transmission line 323. The protrusion 325 is directed outward with the width expanding toward the outside. Furthermore, the interstage matching circuit 311 includes a protrusion 326 in the curved part of the transmission line 324. The protrusion 326 is directed outward with the width expanding toward the outside. The input part 302a of the cell region 302 and the input part 303a of the cell region 303 are connected to the interstage matching circuit 311.

In this embodiment, the output matching circuit 310 is provided at the output of the active element 351. This is because the efficiency of the high-frequency amplifier 30 is improved most effectively by matching the impedance at the fundamental frequency $f_0$ and making the impedance at the second harmonic frequency near-open in the final stage.

The configuration, operation, and effect of this embodiment other than the foregoing are similar to those of the above second embodiment.

Next, a comparative example of the third embodiment is described.

Figure 9:
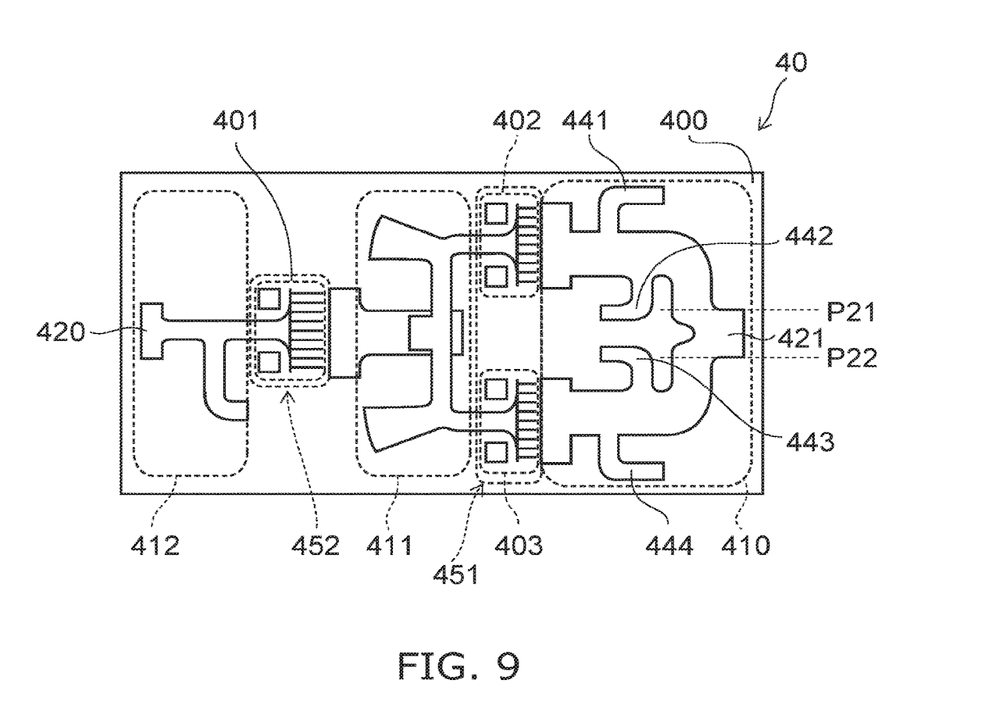
FIG. 9 is a schematic plan view illustrating a high-frequency amplifier according to a comparative example of the third embodiment.

FIG. 9 is a schematic plan view illustrating a high-frequency amplifier according to this comparative example of the third embodiment.

Figure 10:
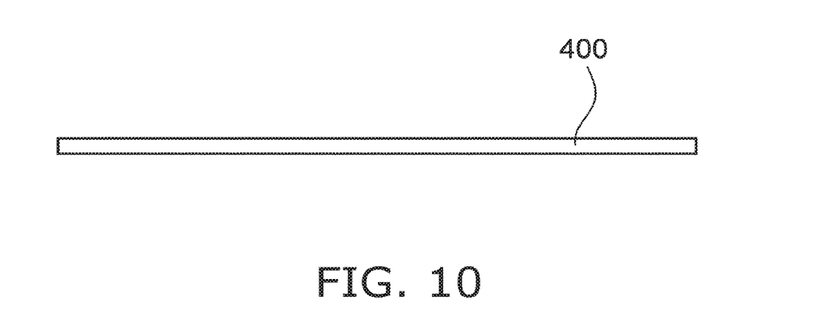

FIG. 10 is a schematic side view in which FIG. 9 is seen from the −Y-direction.

As shown in FIGS. 9 and 10, the high-frequency amplifier 40 according to this comparative example is different from the high-frequency amplifier 30 according to above third embodiment in that the output matching circuit 410 uses stubs 441, 442, 443, and 444 instead of wires.

The configuration of this comparative example other than the foregoing is similar to that of the above third embodiment.

As shown in FIG. 10, the output matching circuit 410 uses the stubs 441, 442, 443, and 444. The stubs 441, 442, 443, and 444 are distributed-parameter elements. Thus, the output matching circuit 410 is more complex than that of the high-frequency amplifier 30 according to above third embodiment. The output matching circuit 410 thus complicated increases the transmission loss. This makes it difficult to operate the high-frequency amplifier 40 at high efficiency. Use of the stubs 441, 442, 443, and 444 enlarges the footprint of the output matching circuit 410. This enlarges the size of the substrate 400, and also increases the cost of the high-frequency amplifier 40.

The embodiments described above can provide a high-frequency amplifier having high efficiency.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A high-frequency amplifier comprising:
    an active element provided on a substrate, configured to amplify a signal having a frequency band, and including a cell region; and
    an output matching circuit connected to the active element,
    the output matching circuit including:
        a wire including an input end and an output end, the input end of the wire being connected to an output part of the cell region of the active element,
        a transmission line provided on the substrate and including an input part and an output part, the input part of the transmission line being connected to the output end of the wire, the transmission line having an electrical length of 0.2 times or more and 0.3 times or less of a wavelength at the center frequency, and
        an output terminal provided on the substrate and connected to the output part of the transmission line,
    the active element having an output impedance of $(R_{out1} - jX_{out1})$ Ω at a center frequency of the frequency band,
    a real part of load impedance seen from a reference plane of the input part of the transmission line being transformed to $(0.8 \times R_{out1})$ Ω or more and $(1.2 \times R_{out1})$ Ω or less at the center frequency in accordance with the electrical length of the transmission line, and an imaginary part of load impedance seen from a reference plane of the input end of the wire being transformed to a larger value $(0.8 \times X_{out1})$ Ω or more and $(1.2 \times X_{out1})$ Ω or less at the center frequency due to addition of inductive reactance of the wire.

2. The amplifier according to claim 1, wherein an imaginary part of load impedance seen from the reference plane of the input end of the wire is transformed to a value larger than $(1.2 \times X_{out1})$ S at a frequency of twice the center frequency due to addition of inductive reactance of the wire.

3. The amplifier according to claim 1, wherein the cell region and the wire are connected through a pad.

4. The amplifier according to claim 1, further comprising:
one other wire including an input end and an output end; and
an input matching circuit connected to the input end of the one other wire,
wherein an input part of the cell region is connected to the output end of the one other wire.

5. The amplifier according to claim 4, wherein the cell region and the one other wire are connected through one other pad.

6. A high-frequency amplifier comprising:
a first active element provided on a substrate, configured to amplify a signal having a frequency band, and including a first cell region and a second cell region;
a first wire including an input end and an output end, the input end of the first wire being connected to an output part of the first cell region;
a second wire including an input end and an output end, the input end of the second wire being connected to an output part of the second cell region;
a first transmission line provided on the substrate and including an input part and an output part, the input part of the first transmission line being connected to the output end of the first wire, the first transmission having an electrical length of 0.2 times or more and 0.3 times or less of wavelength at the center frequency;
a second transmission line provided on the substrate and including an input part and an output part, the input part of the second transmission line being connected to the output end of the second wire, the second transmission line having an electrical length of 0.2 times or more and 0.3 times or less of wavelength at the center frequency; and
an output terminal provided on the substrate and connected to the output part of the first transmission line and the output part of the second transmission line,
the first active element having an output impedance of $(R_{out1} - jX_{out1})$ Ω at a center frequency of the frequency band,
a real part of load impedance seen from a reference plane of the input part of the first transmission line and the input part of the second transmission line being transformed to $(0.8 \times R_{out1})$ Ω or more and $(1.2 \times R_{out1})$ Ω or less at the center frequency in accordance with the electrical length of the first and second transmission lines, and
an imaginary part of load impedance seen from a reference plane of the input end of the first wire and the input end of the second wire being transformed to $(0.8 \times X_{out1})$ Ω or more and $(1.2 \times X_{out1})$ Ω or less at the center frequency due to addition of inductive reactance of the first and second wires.

7. The amplifier according to claim 6 further comprising:
an interstage matching circuit provided on the substrate and connected to an input part of the first cell region and an input part of the second cell region.

8. The amplifier according to claim 7, further comprising:
a second active element provided on the substrate and connected to an input terminal of the interstage matching circuit.

9. The amplifier according to claim 8, further comprising:
an input matching circuit provided on the substrate and connected to an input end of the second active element.

* * * * *